United States Patent
Osato et al.

(10) Patent No.: US 7,884,630 B2
(45) Date of Patent: Feb. 8, 2011

(54) IC CARRIE, IC SOCKET AND METHOD FOR TESTING IC DEVICE

(75) Inventors: Eichi Osato, Musashino (JP); Junichi Kasai, Tokyo (JP); Kouichi Meguro, Tokyo (JP); Masanori Onodera, Tokyo (JP)

(73) Assignees: Micronics Japan Co., Ltd., Tokyo (JP); Spansion LLC, Sunnyvale, CA (US); SPANSION Japan Limited, Aizuwakamatsu-shi (JP)

( * ) Notice: Subject to any disclaimer, the term of this patent is extended or adjusted under 35 U.S.C. 154(b) by 314 days.

(21) Appl. No.: 11/886,139

(22) PCT Filed: Mar. 11, 2005

(86) PCT No.: PCT/JP2005/004286

§ 371 (c)(1),
(2), (4) Date: Mar. 13, 2008

(87) PCT Pub. No.: WO2006/097973

PCT Pub. Date: Sep. 21, 2006

(65) Prior Publication Data

US 2008/0191723 A1 Aug. 14, 2008

(51) Int. Cl.
*G01R 31/02* (2006.01)
(52) U.S. Cl. ................................................ 324/755
(58) Field of Classification Search ........................ None
See application file for complete search history.

(56) References Cited

U.S. PATENT DOCUMENTS

| | | | | |
|---|---|---|---|---|
| 4,329,642 A | * | 5/1982 | Luthi et al. | 324/755 |
| 4,560,216 A | * | 12/1985 | Egawa | 324/755 |
| 5,074,798 A | * | 12/1991 | Carter | 439/72 |

(Continued)

FOREIGN PATENT DOCUMENTS

JP 02-027735 U 2/1990

(Continued)

OTHER PUBLICATIONS

International Search Report (English and Japanese) for PCT/JP2005/004286 dated Apr. 12, 2005. 4 Sheets.

*Primary Examiner*—Jermele M Hollington
(74) *Attorney, Agent, or Firm*—Holtz, Holtz, Goodman & Chick, PC

(57) ABSTRACT

An IC device (10) held on an IC carrier (24) is a double-sided electrode type BGA IC device (10) provided with bump electrodes (14) on a first surface of a package. The IC device has, on a second surface opposite the first surface, (a) a central protrusion (30), (b) a peripheral portion (32) lower than the protrusion by one step, and (c) upper electrodes (18) formed on the peripheral portion of the IC device. The IC carrier is provided with a frame (36), a cover (40), and a holding means (42). The frame forms a device reception space (38) for receiving the IC device. The cover can cover the upper electrodes while in contact with the periphery of the IC device held on the IC carrier. The holding means can hold the IC device on the IC carrier with the cover covering the upper electrodes of the IC device. The IC device can be set in an IC socket while being mounted on the IC carrier.

20 Claims, 17 Drawing Sheets

U.S. PATENT DOCUMENTS

| | | | |
|---|---|---|---|
| 5,738,528 A | * | 4/1998 | Matsuoka et al. ........... 439/525 |
| 5,885,101 A | * | 3/1999 | Matsuoka et al. ........... 439/526 |
| 6,018,248 A | * | 1/2000 | Kelley et al. ............... 324/755 |

FOREIGN PATENT DOCUMENTS

| | | |
|---|---|---|
| JP | 03-119673 A | 5/1991 |
| JP | 2000-243867 A | 9/2000 |
| JP | 2000-266808 A | 9/2000 |
| JP | 2000-323249 A | 11/2000 |
| JP | 2003-124439 A | 4/2003 |

\* cited by examiner

[Fig. 1]
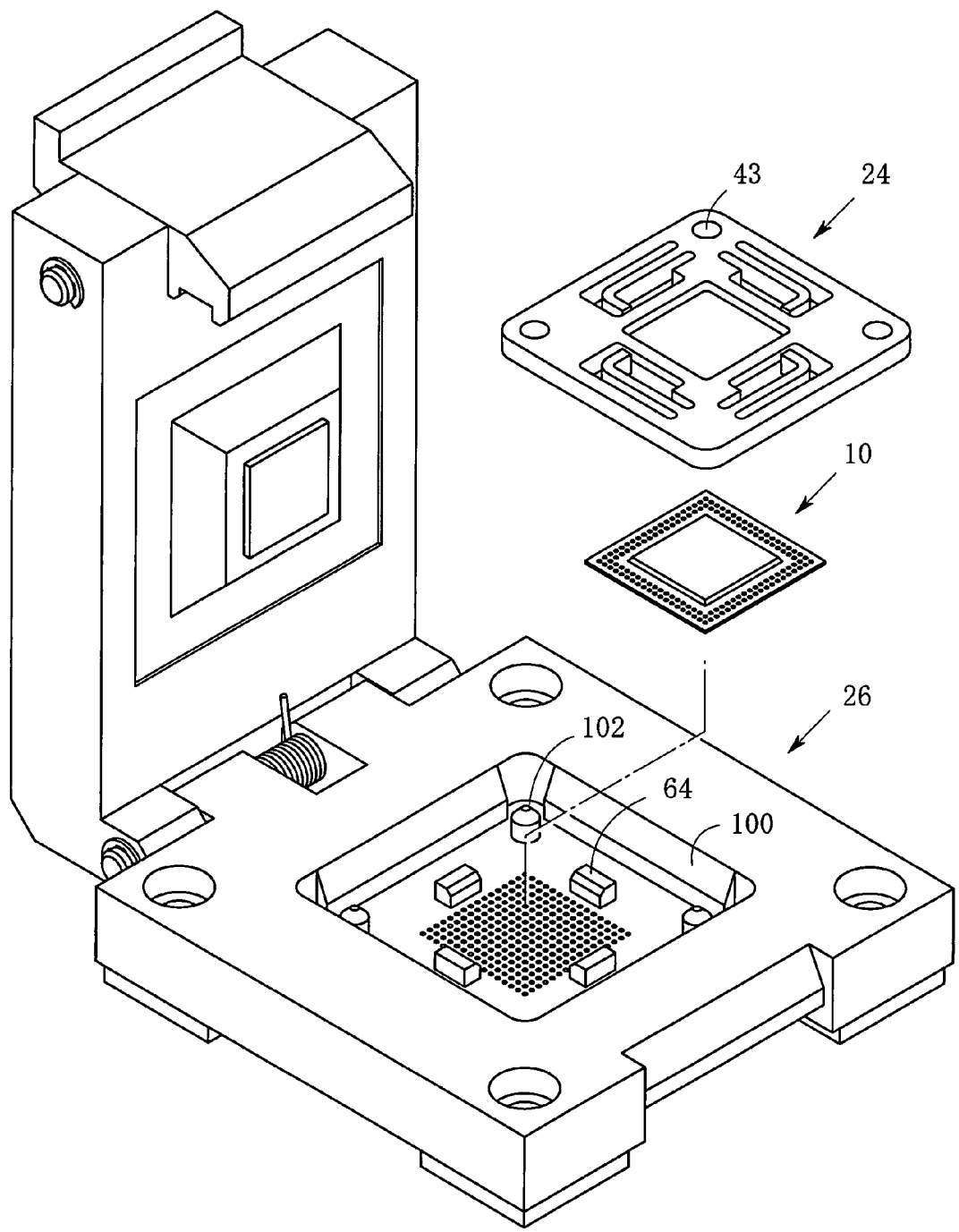

[Fig. 2]
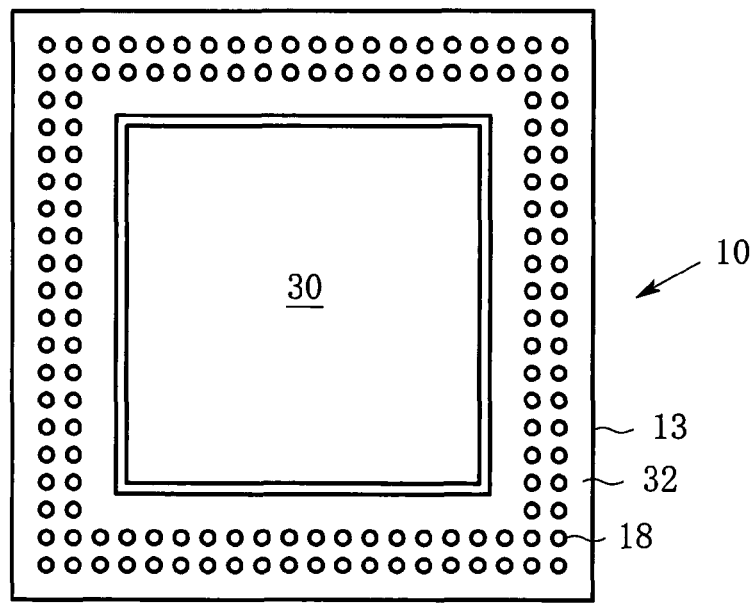
(A)
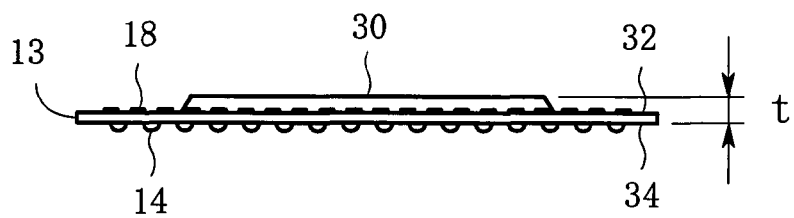
(B)
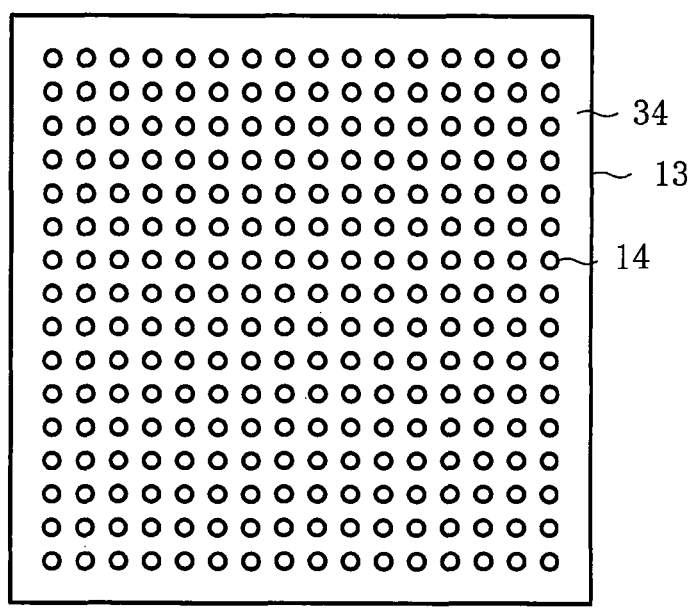
(C)

[Fig. 3]
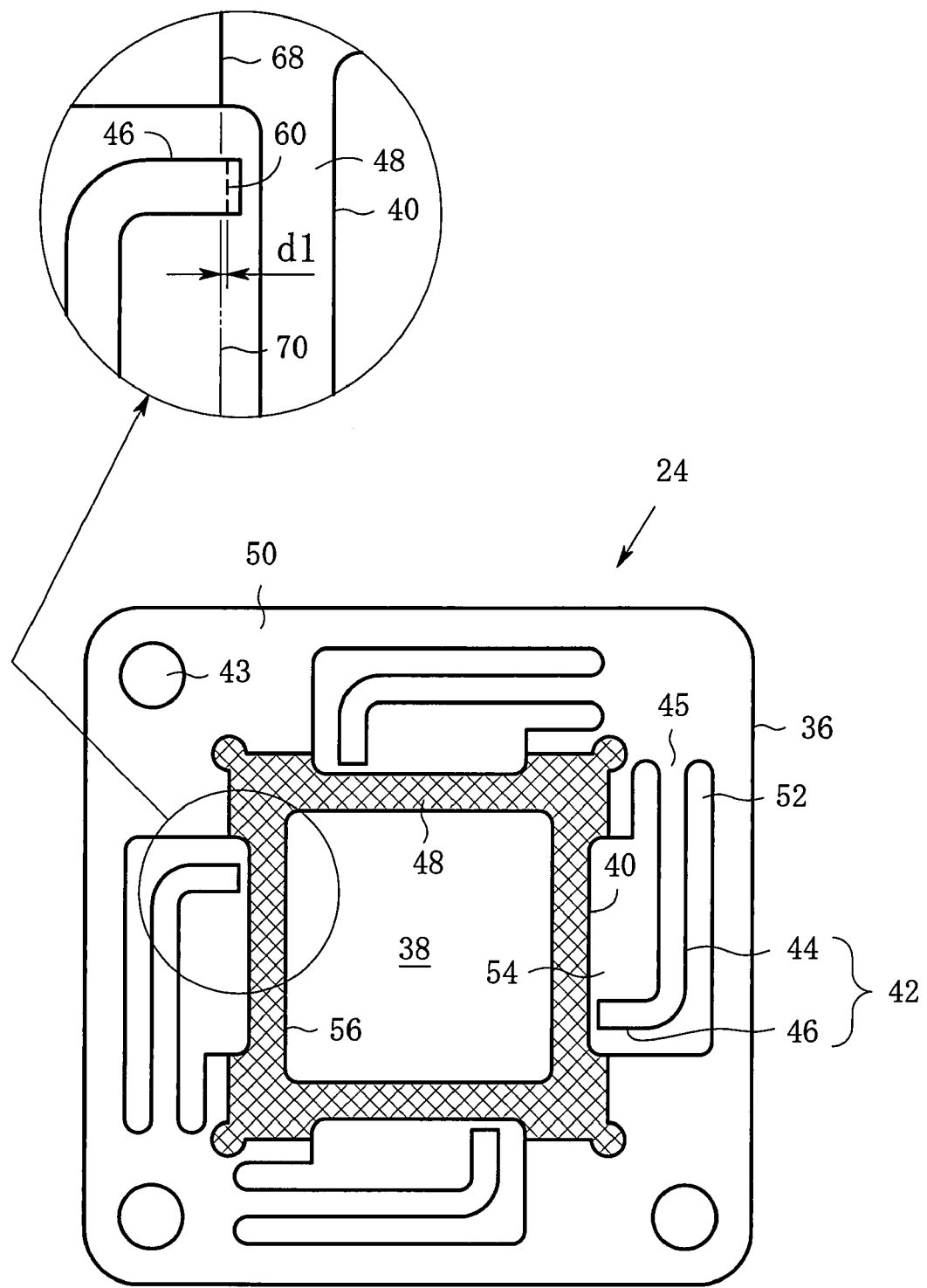

[Fig. 4]
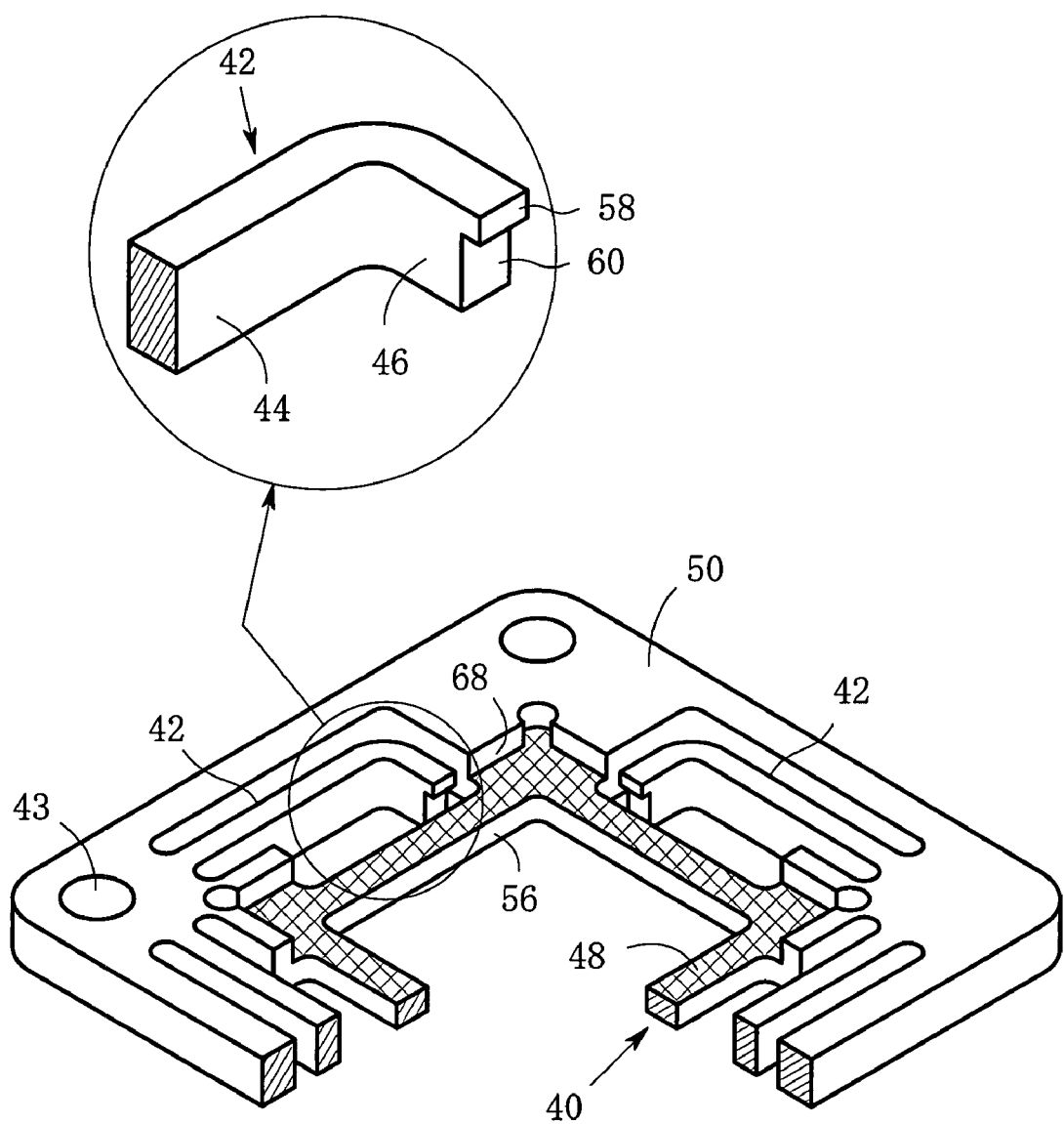

[Fig. 5]
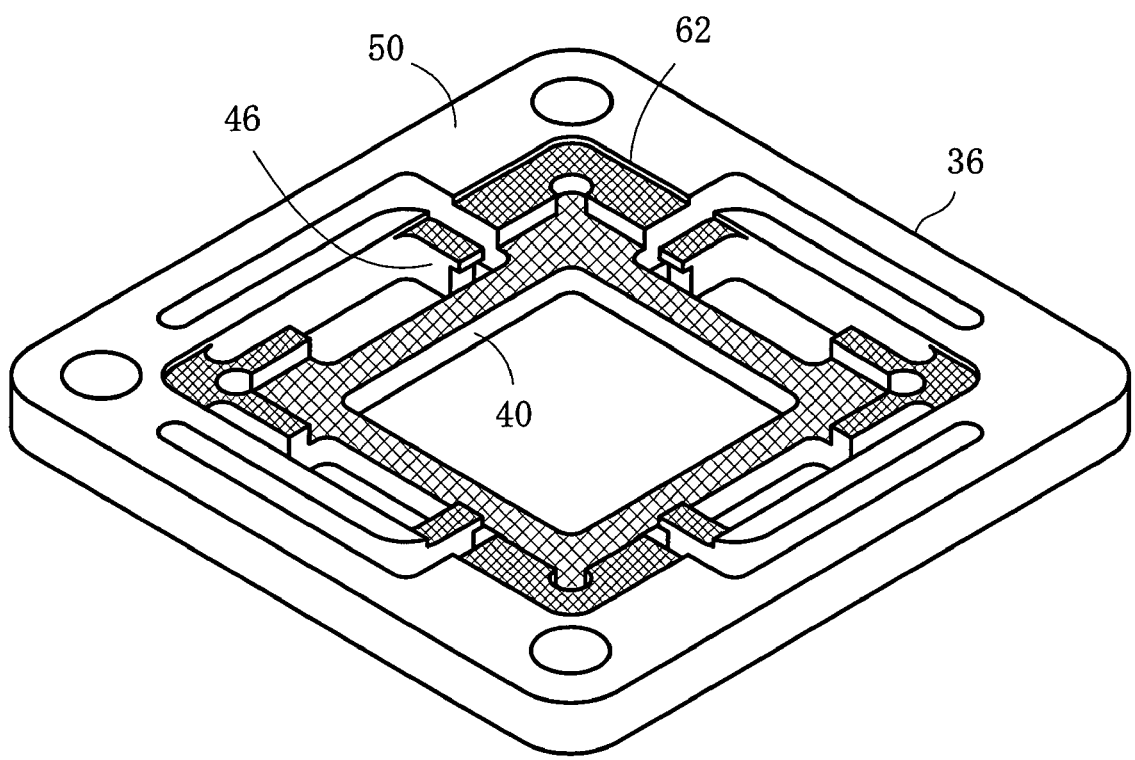

[Fig. 6]
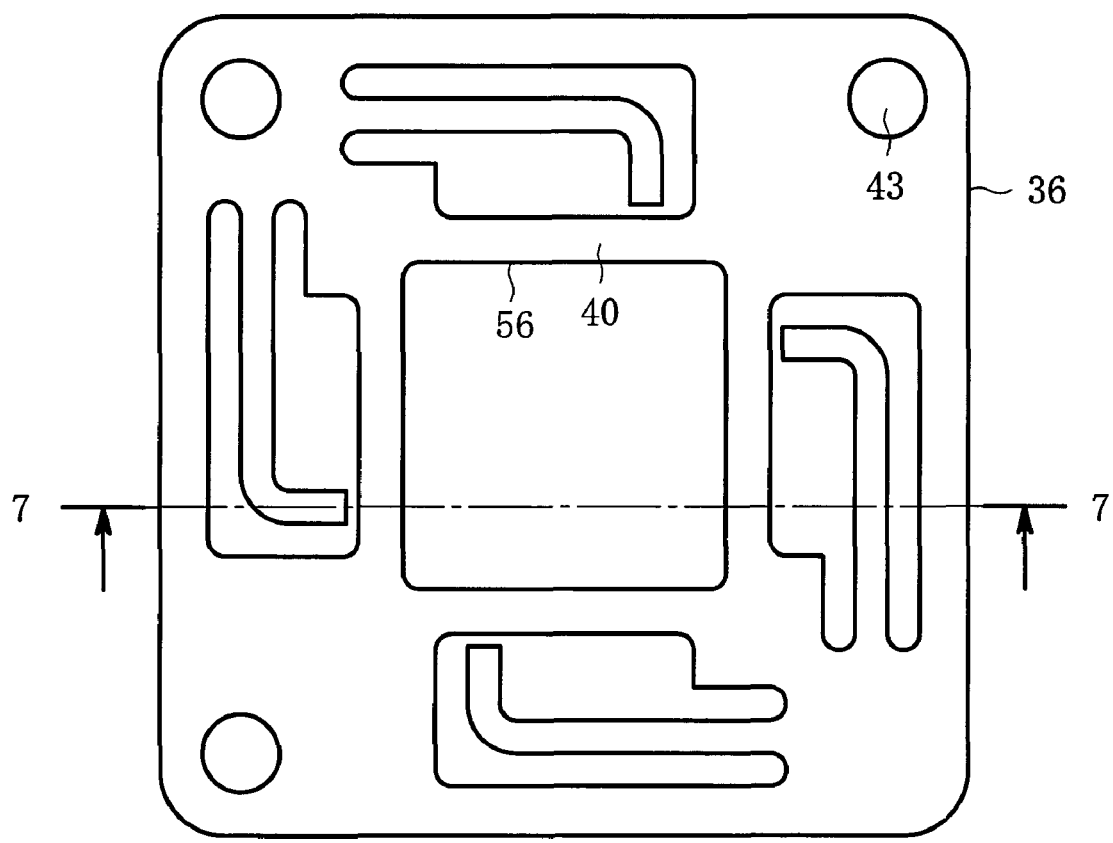

[Fig. 7]
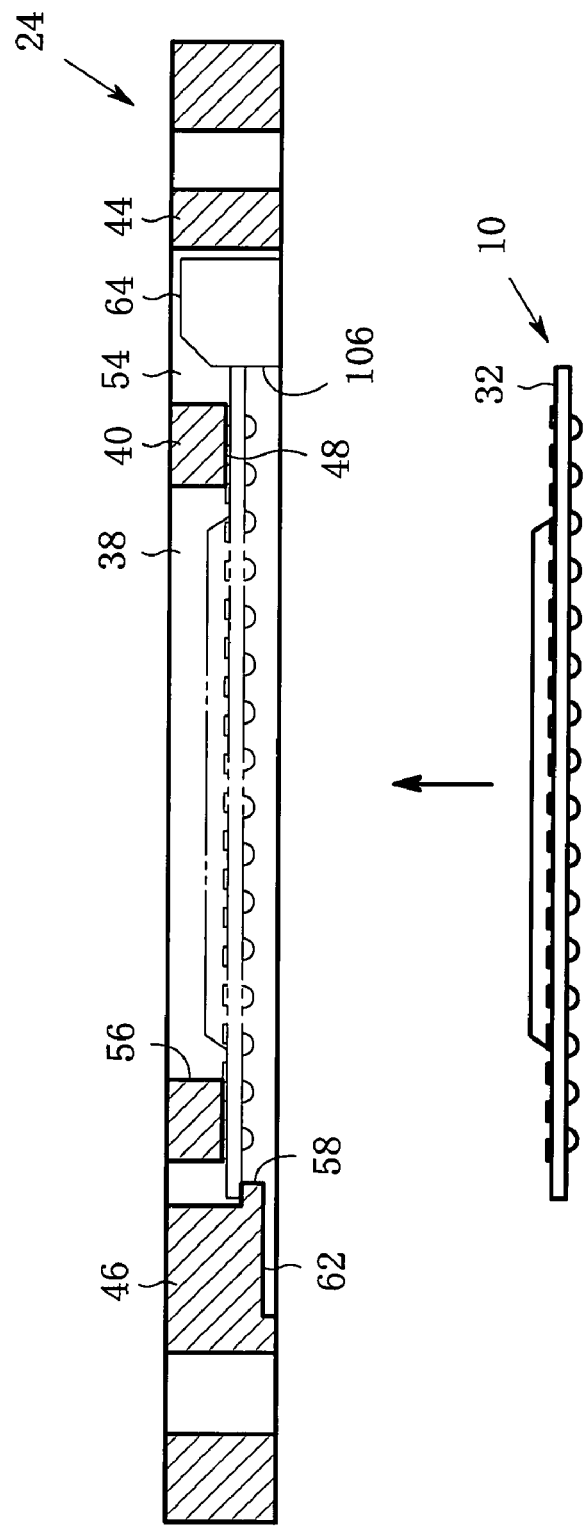

[Fig. 8]
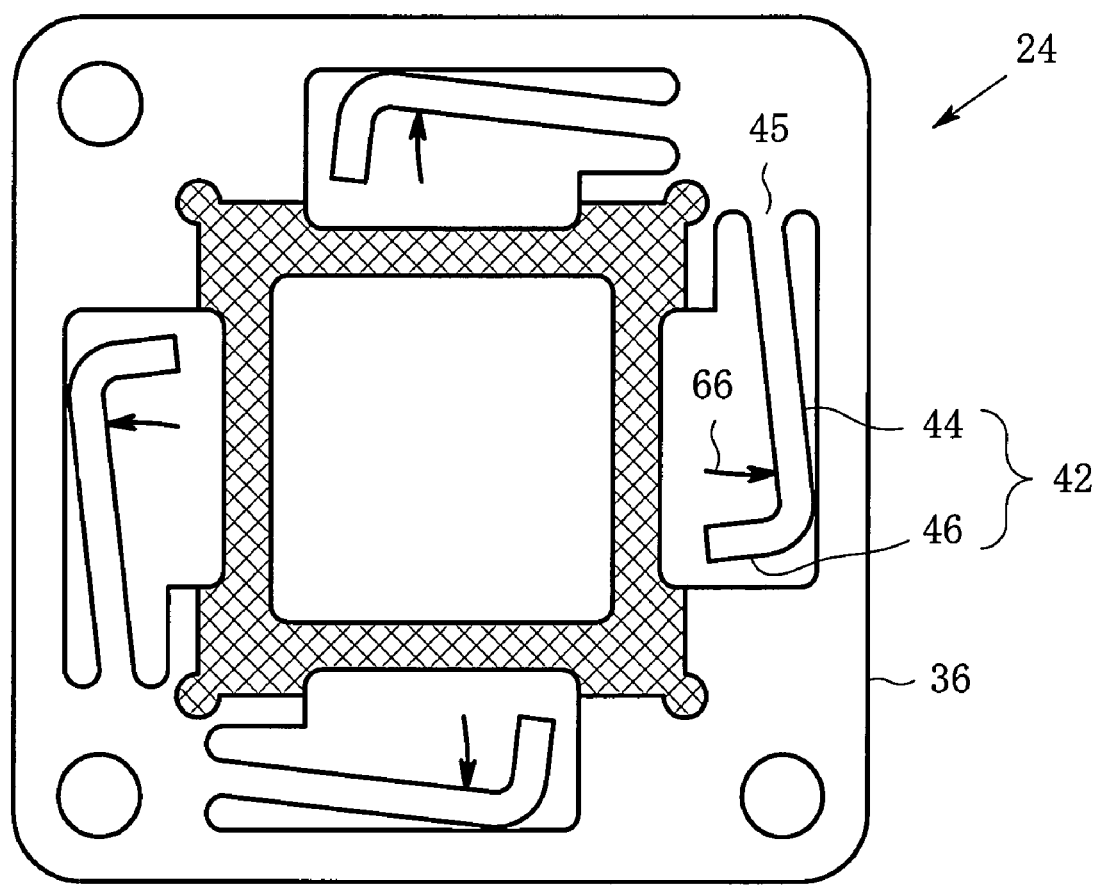

[Fig. 9]
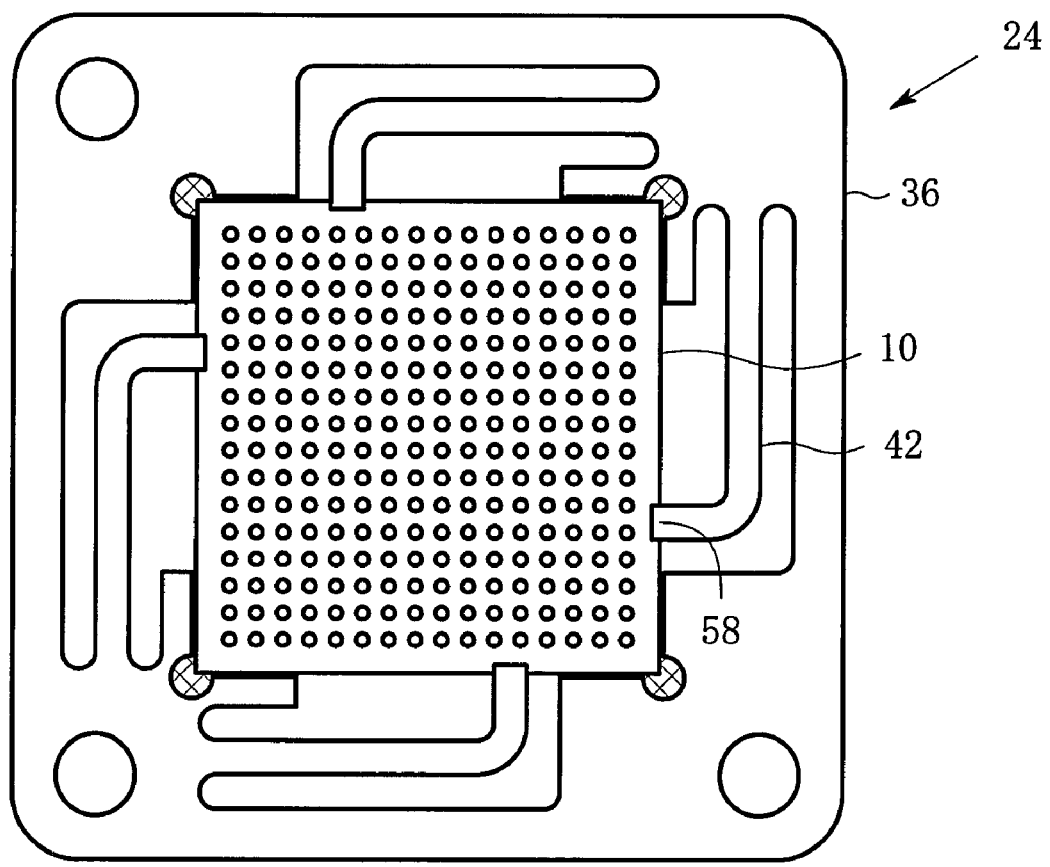

[Fig. 10]
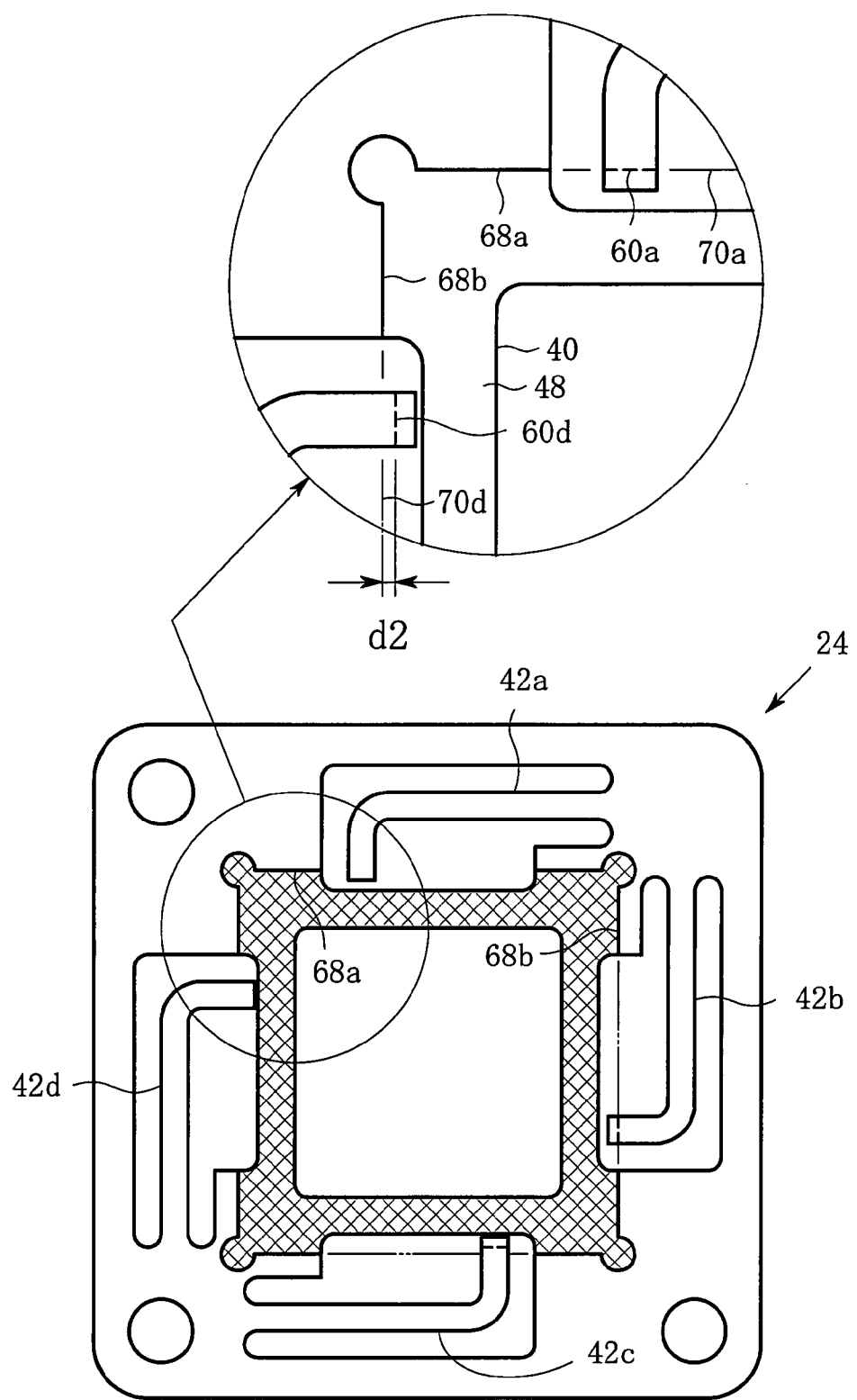

[Fig. 11]
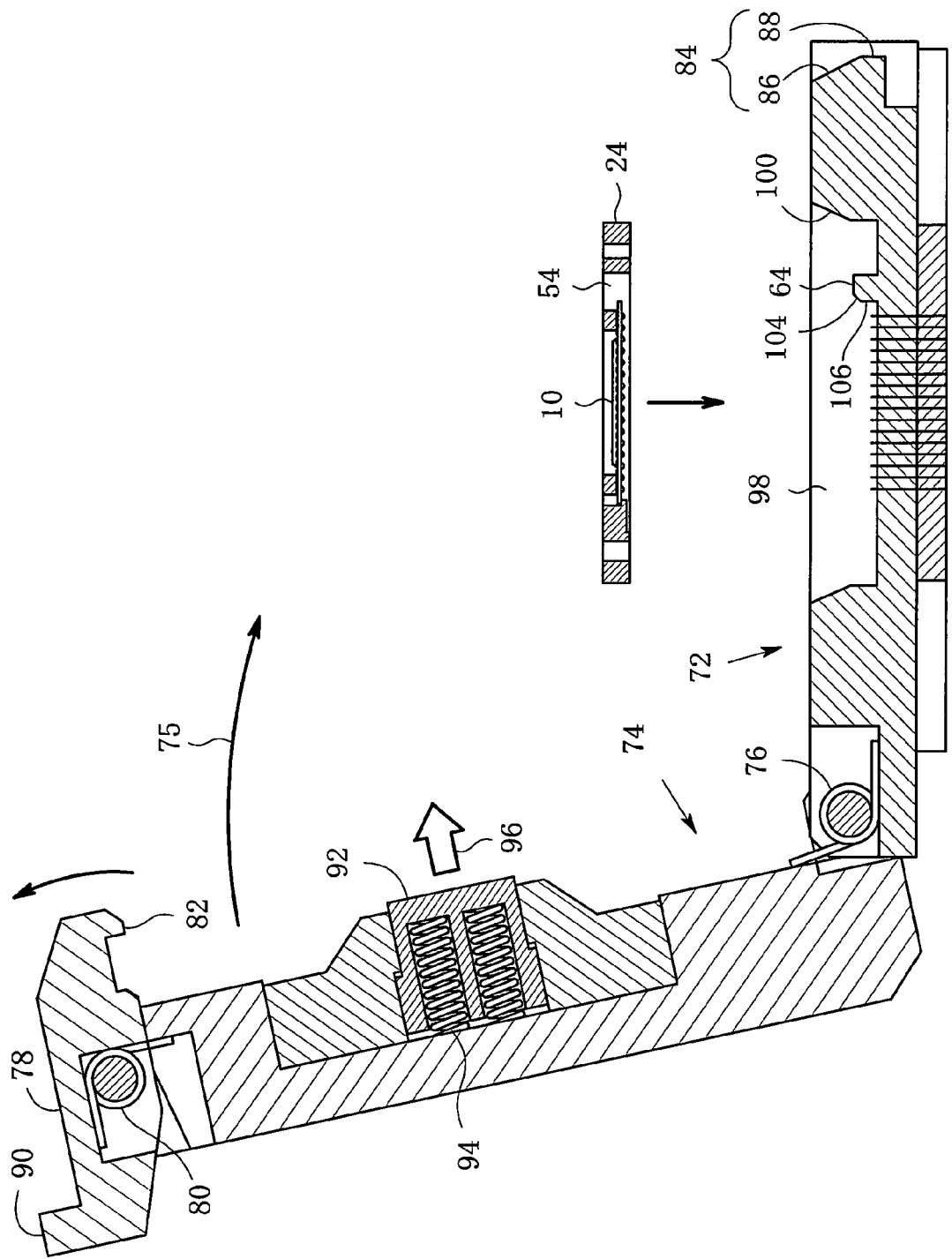

[Fig. 12]
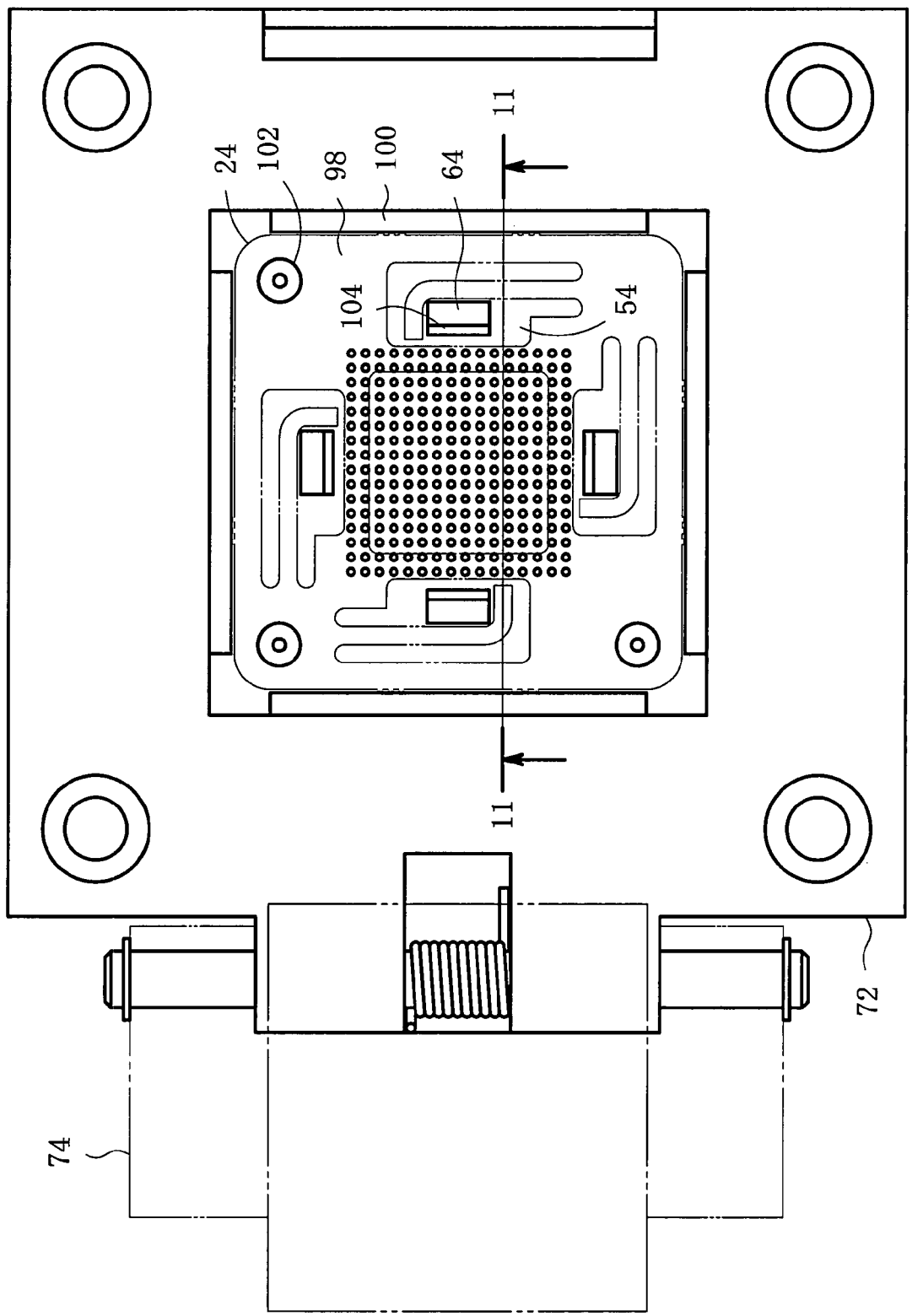

[Fig. 13]
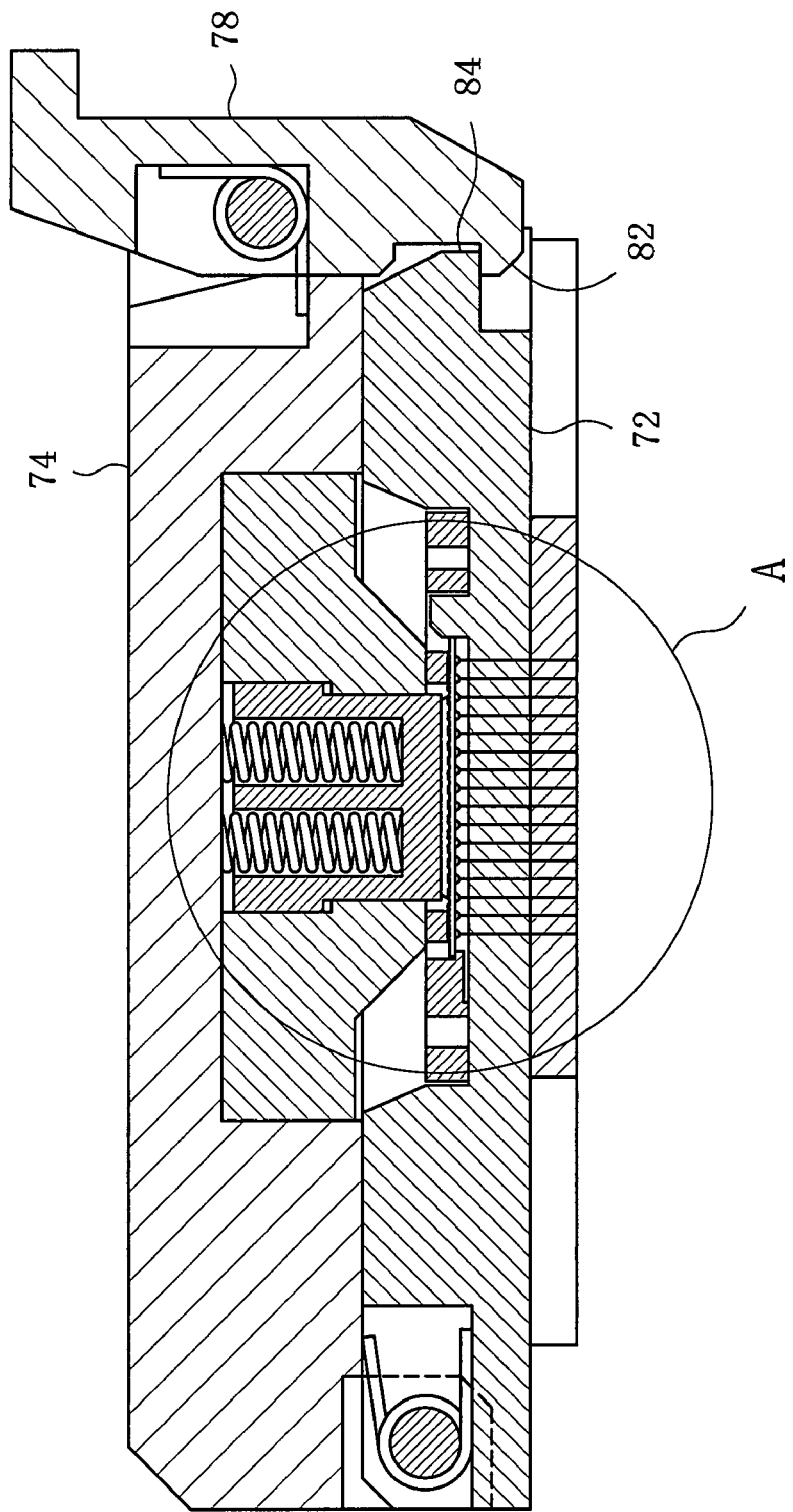

[Fig. 14]
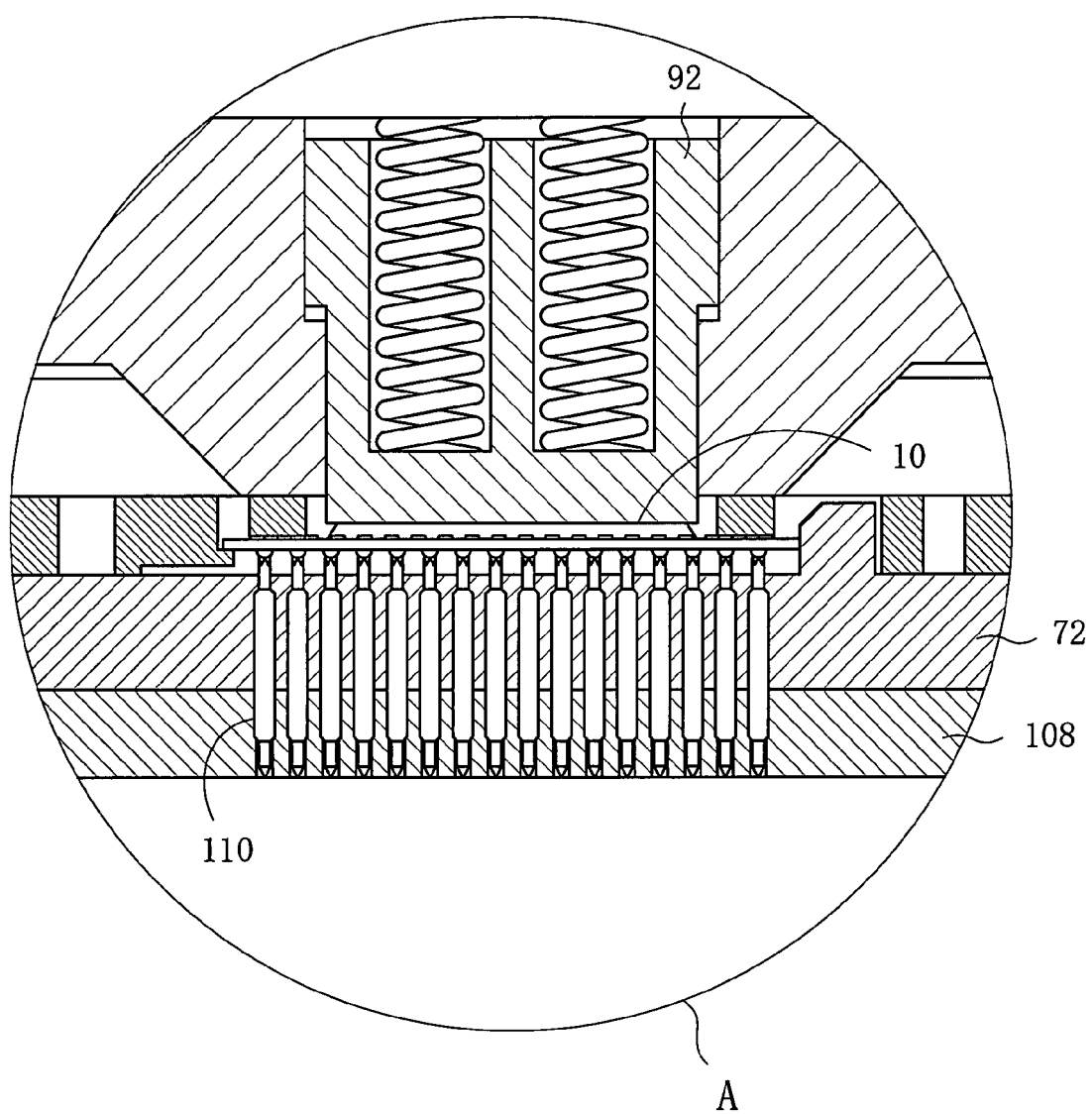

[Fig. 15]
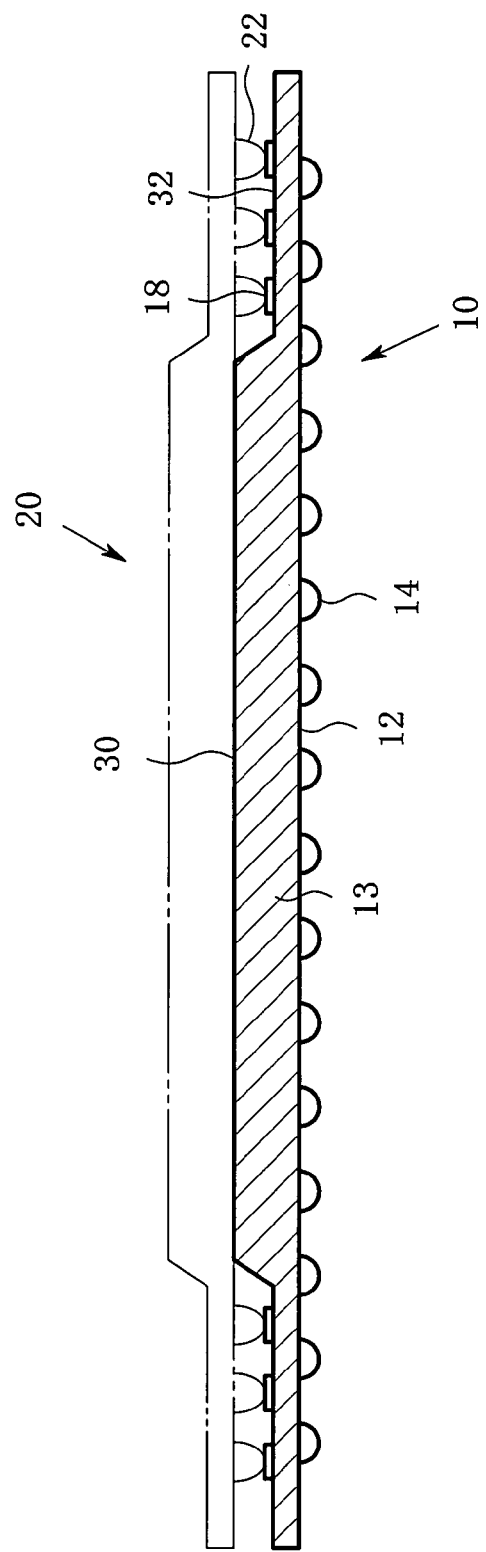

[Fig. 16]
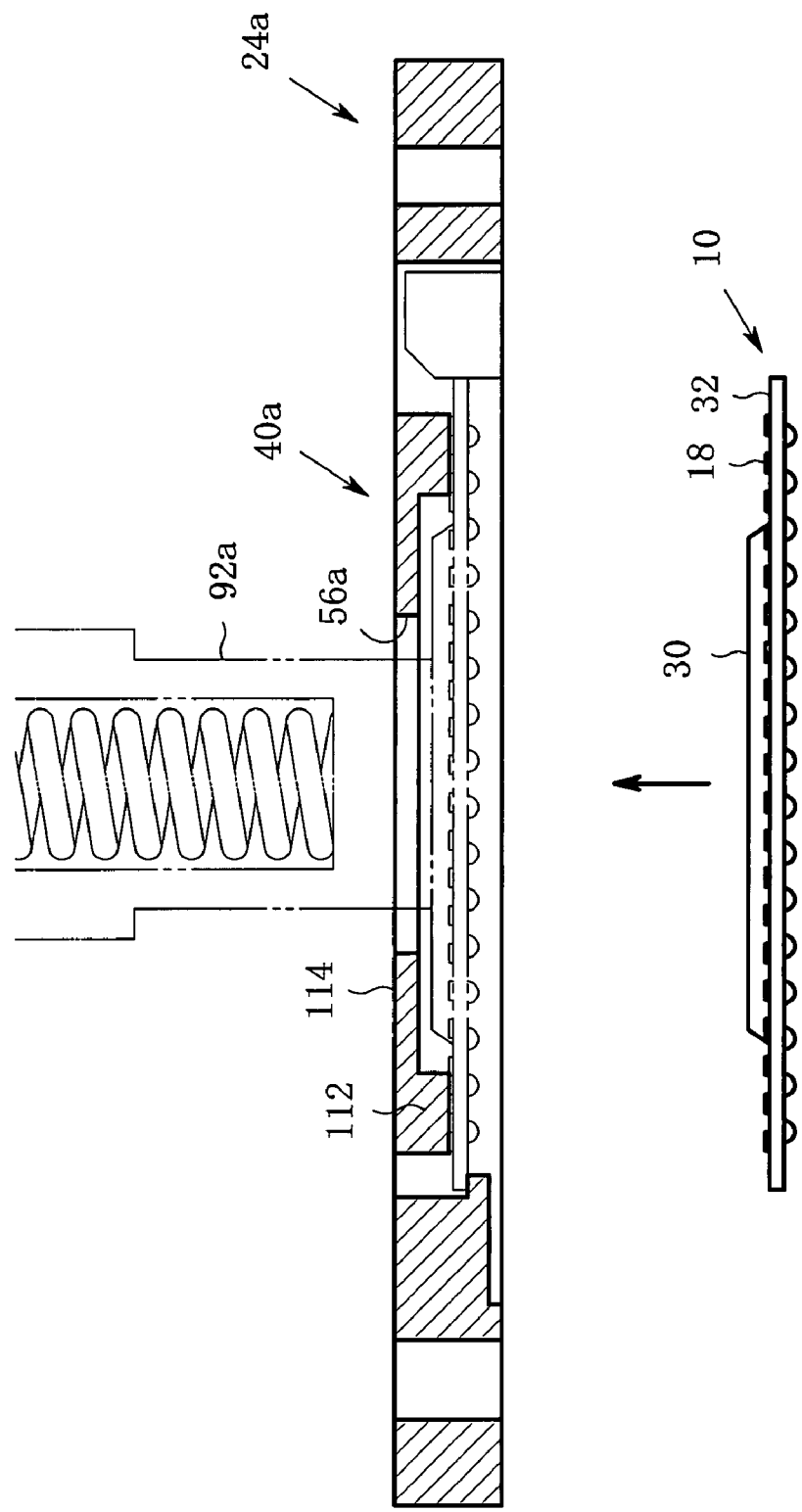

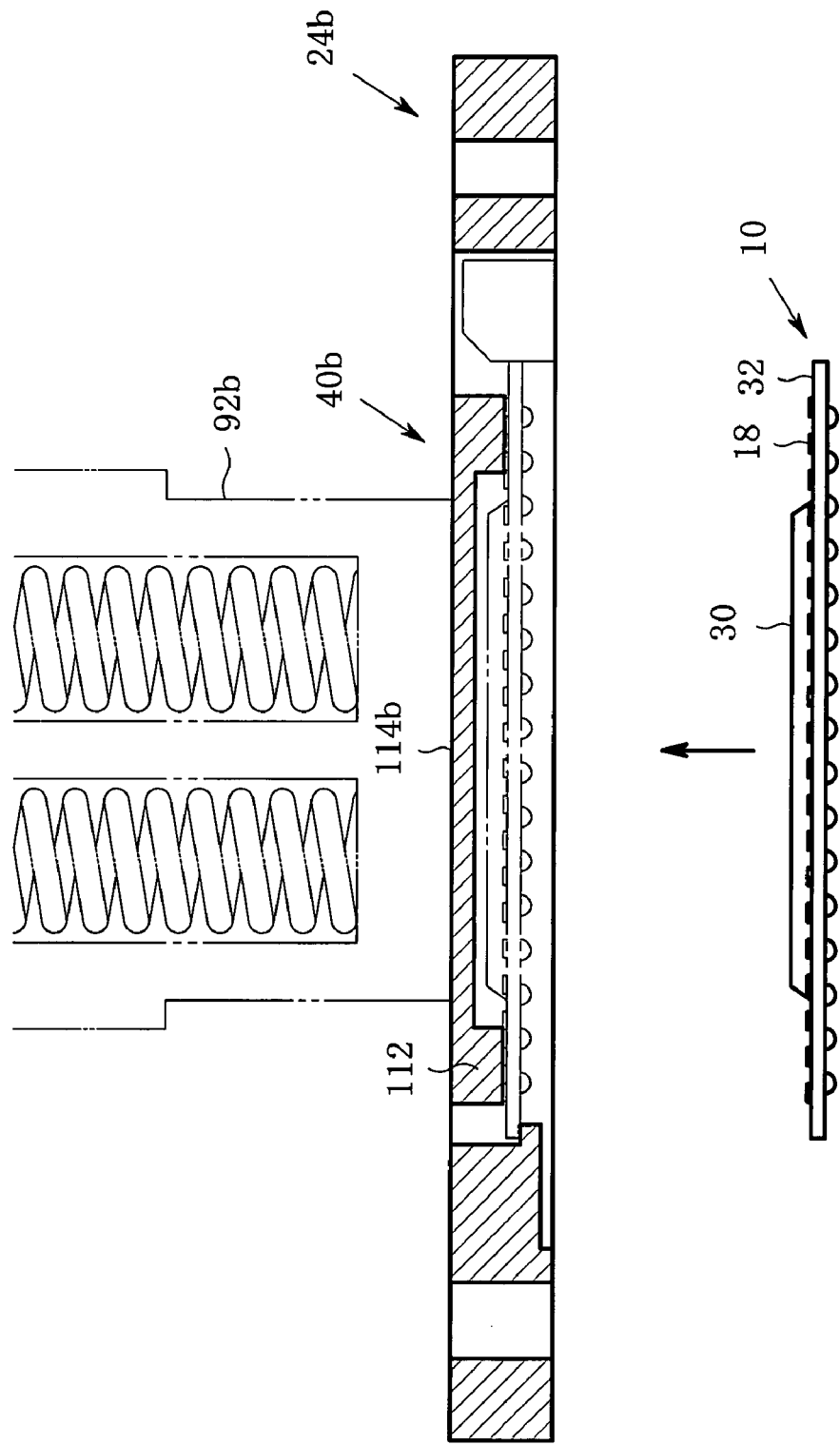
[Fig. 17]

US 7,884,630 B2

IC CARRIE, IC SOCKET AND METHOD FOR TESTING IC DEVICE

This application is a U.S. National Phase Application under 35 USC 371 of International Application PCT/JP2005/004286 filed Mar. 11, 2005.

TECHNICAL FIELD

The present invention is concerned with a BGA (Ball Grid Array) IC device having electrodes on both sides and relates to an IC carrier for receiving such an IC device, an IC socket to which such an IC device is installed and a method for testing such an IC device.

BACKGROUND ART

The BGA IC device has a plurality of bump electrodes on the bottom surface of a package, the bump electrodes being arranged in a grid pattern. The ordinary BGA IC device has the electrodes only on the bottom surface of the package and accordingly has no electrodes on the top surface of the package. On the contrary, there is known a device having electrodes on the top surface too in addition to the bottom surface. Such a device will be referred to as a double-sided electrode type hereinafter. The double-sided electrode type BGA IC device is disclosed in the first and second patent publications mentioned below.

First Patent Publication: Japanese Patent Publication 2003-124439 A.

Second Patent Publication: Japanese Patent Publication 2000-243867 A.

FIG. 15 is a front sectional view of one example of the double-sided electrode type BGA IC device. An IC device 10 has a package 13 which has a flat bottom surface 12 provided with a plurality of bump electrodes 14. On the other hand, the package 13 has a top surface which has a central protrusion 30 and a peripheral portion 32 surrounding the protrusion 30. The peripheral portion 32 is lower than the protrusion 30 by one step. The protrusion 30 contains an IC chip therein. The peripheral portion 32 is provided with a plurality of electrodes 18 (which will be referred to as upper electrodes hereinafter). Such a double-sided electrode type BGA IC device 10 can support, on its top surface, another BGA IC device 20 stacked directly on the device 10 so that the two devices can be connected to each other. Namely, bump electrodes 22 on the bottom surface of another IC device 20 are connected to the upper electrodes 18 of the IC device 10 so that the two IC devices 10 and 20 are fixedly connected to each other. If the upper IC device 20 is of the double-sided electrode type too, it is possible to stack BGA IC devices in three or more layers.

Incidentally, regarding installation of the BGA IC device to an IC socket for testing it electrically, two methods are known: one method is installation of the IC device directly to the IC socket; and the other method is mounting the IC device on an IC carrier and installation of the IC carrier along with the IC device to the IC socket. The latter method is better for especially a thin IC device because it can be handled under the protected condition. The present invention is concerned with the latter installation method. The following third and fourth patent publications disclose installation of the BGA IC device to an IC socket while the IC device is mounted on a carrier.

Third Patent Publication: Japanese Patent Publication 2000-266808 A.

Fourth Patent Publication: Japanese Patent Publication 2000-323249 A.

The third and fourth patent publications disclose that the ordinary BGA IC device having electrodes only on the bottom surface is mounted on an IC carrier and thereafter the IC carrier along with the IC device is installed to an IC socket.

DISCLOSURE OF INVENTION

Problems to be Solved by Invention

It is not known to try install the double-sided electrode type BGA IC device to an IC socket while the IC device is mounted on an IC carrier. Even if the conventional IC carrier is used as a trial, it would fail because the IC carrier has no care for the protection of the upper electrodes. This problem will be described below. Assuming that the double-sided electrode type BGA IC device is mounted on the conventional IC carrier disclosed in the above-mentioned third and fourth patent publications, the IC device is to be mounted in a recess of the IC carrier. In such a case, the IC device must be mounted so that the bump electrodes of the IC device are exposed to an opening of the recess, and therefore the protrusion of the IC device is to be in contact with the bottom surface of the recess of the IC carrier. As shown in FIG. 15, since the peripheral portion 32 is lower than the protrusion 30 by one step, the upper electrodes 18 provided on the peripheral portion 32 are to be placed in the IC carrier away from the bottom surface of the recess of the IC carrier. Under such a condition that the upper electrodes 18 of the IC device are placed in the IC carrier away from the bottom surface of the IC carrier, the upper electrodes 18 are apt to be contaminated.

The present invention has been developed to solve the problems mentioned above, and an object of the present invention is to provide an IC carrier with which the double-sided electrode type BGA IC device can be installed to an IC socket while the IC device is mounted on the IC carrier. Another object of the present invention is to provide an IC carrier which can prevent the contamination of the upper electrodes of the double-sided electrode type BGA IC device. Further another object of the present invention is to provide an IC socket to which such an IC carrier can be installed. Further another object of the present invention is to provide a method for testing the double-sided electrode type BGA IC device while being mounted on the IC socket.

Means for Solving Problems

An IC carrier according to the present invention is for holding a Ball Grid Array IC device having electrodes on both sides. The IC device includes a package which has a first surface having a plurality of bump electrodes. The IC device has, on a second surface opposite the first surface, (a) a central protrusion, (b) a peripheral portion which surrounds the protrusion and is lower than the protrusion by one step and (c) a plurality of upper electrodes provided on the peripheral portion. And then, the IC carrier according to the present invention comprises a frame, a cover portion, and holding means. The frame forms a device reception space for receiving the IC device. The cover portion is adapted to cover the upper electrodes while in contact with the peripheral portion of the IC device held on the IC carrier. The holding means is provided in the frame and is adapted to hold the IC device in the IC carrier while the cover portion covers the upper electrodes of the IC device.

The cover portion of the IC carrier may be in contact with the peripheral portion of the IC device under any conditions described below. Since the peripheral portion is provided with the upper electrodes, the cover portion is in contact with the upper electrodes if the upper electrodes project from the package surface at the peripheral portion. If the upper electrodes are lower than the package surface at the peripheral portion, the cover portion is in contact with the package surface at the peripheral portion. If the upper electrodes and the package surface are approximately in plane with each other, the cover portion is in contact with both the upper electrodes and the package surface at the same time or in contact with either.

The double-sided electrode type BGA IC device can be transferred and tested while it is held on the IC carrier, and therefore it can be easily handled in no danger of breakage even if it is a thin IC device. In addition, since the upper electrodes on the second surface of the IC device is covered with the cover portion of the IC carrier while the IC device is held on the IC carrier, the upper electrodes of the IC device is in no danger of contamination in the processes of transfer and testing.

An IC device which should be held on the IC carrier is typically rectangular in outline. The frame of the IC carrier may be provided with preferably a plurality of positioning holes. The bump electrodes on the first surface of the IC device are exposed while the IC device is held on the IC carrier. When the IC carrier is installed to an IC socket, the bump electrodes of the IC device which is held on the IC carrier are to be in contact with the terminals of the IC socket.

The cover portion of the IC carrier may be provided with a through-hole, which allows at least a part of the protrusion of the IC device held on the IC carrier to be exposed. When the IC carrier is installed to the IC socket, a device presser of the IC socket can pass through the through-hole to press directly the protrusion of the IC device, so that the bump electrodes of the IC device can be pressed against the terminals of the IC socket. Therefore, the contact pressure between the bump electrodes of the IC device and the terminals of the IC socket can be set as close to the desired design value as possible in comparison with the case that the IC device is pressed via the cover portion indirectly.

The holding means which is provided in the frame of the IC carrier may include a resilient arm, which has a tip end provided with a claw which is adapted to engage with a lateral edge of the IC device. The resilient arm may be formed preferably to be integrated with the frame. For example, the frame and the resilient arm may be formed by resin to be integrated with each other.

In the case of a rectangular IC device, the holding means of the IC carrier may have four L-shape resilient arms, each of which has a tip end provided with a claw, the claws engaging with the four lateral edges of the IC device respectively. The resilient arm has a first part and a second part. The first part extends substantially parallel to a lateral face of the IC device held on the IC carrier. The second part is connected to the first part and bent with respect to the first part. The second part has a tip end provided with the claw mentioned above. In addition, a guide reception space is formed between the first part of the resilient arm and the lateral face of the IC device. The guide reception space is adapted to receive a device guide which guides the lateral face of the IC device, the device guide being formed on the IC socket. Therefore, the IC socket is guided directly by the device guide of the IC socket so as to be located while the IC socket is held on the IC carrier. The positioning accuracy of the IC device does not depend on the positioning accuracy between the IC carrier and the IC socket. Accordingly, a high positioning accuracy is not required between the IC carrier and the IC socket, that is, between positioning holes of the IC carrier and positioning pins of the IC socket.

An IC socket according to the present invention is for receiving the IC carrier mentioned above, and has a housing, a plurality of positioning pins, a device guide, a plurality of terminals and a device presser. The housing forms a carrier reception space which receives the IC carrier. The positioning pins are provided on the housing and are adapted to be inserted into the positioning holes of the IC carrier to locate the IC carrier with respect to the IC socket. The device guide is provided in the housing and is adapted to be inserted into the guide reception space of the IC carrier to guide the lateral face of the IC device so that the IC device is located with respect to the IC socket. The terminals are fixed to the housing and are able to electrically contact the bump electrodes of the IC device. The device presser has any one of two abilities: an ability to go into a through-hole which is formed in the cover portion of the IC carrier to press the IC device toward the terminals of the IC socket; and another ability to contact the cover portion of the IC carrier to press the cover portion toward the terminals of the IC socket.

A method for testing an IC device according to the present invention comprises the steps of: holding the IC device on the IC carrier mentioned above; and testing the IC device while being held on the IC carrier.

Effect of Invention

The present invention has an advantage that the double-sided electrode type BGA IC device can be transferred and tested while the IC device is held on the IC carrier, and therefore the IC device can be easily handled in no danger of breakage even if it is a thin device. In addition, since the upper electrodes on the second surface of the IC device are covered with the cover portion of the IC carrier, the upper electrodes of the IC device are in no danger of contamination.

When the cover portion of the IC carrier is provided with the through-hole, the contact pressure between the bump electrodes of the IC device and the terminals of the IC socket can be set as close to the desired design value as possible in comparison with the case that the IC device is pressed via the cover portion indirectly.

When the holding means of the IC carrier has a resilient arm and the guide reception space is formed between the resilient arm and the lateral face of the IC device, the guide reception space can receive the device guide of the IC socket. Therefore, the IC device is guided directly by the device guide so as to be located. Accordingly, the device can be located with a high accuracy even if without a high positioning accuracy between the positioning holes of the IC carrier and the positioning pins of the IC socket.

BRIEF DESCRIPTION OF DRAWINGS

FIG. 1 is an overall perspective view showing the first embodiment of an IC carrier according to the present invention and an IC socket to which the IC carrier is installed.

FIG. 2 shows a plan view, a front view and a bottom view of an IC device which can be mounted on the first embodiment of the IC carrier according to the present invention.

FIG. 3 is a bottom view of the first embodiment of the IC carrier according to the present invention.

FIG. 4 is a perspective view of the IC carrier shown in FIG. 3 as viewed from the bottom side.

FIG. 5 is a perspective view of the second embodiment of the IC carrier according to the present invention as viewed from the bottom side.

FIG. 6 is a plan view of the IC carrier shown in FIG. 3.

FIG. 7 is a sectional end view taken along the line 7-7 in FIG. 6.

FIG. 8 is a bottom view of the IC carrier shown in FIG. 3 while the resilient arms are in the open states.

FIG. 9 is a bottom view of the IC carrier shown in FIG. 3 while the IC carrier holds the IC device.

FIG. 10 is a bottom view of the third embodiment of the IC carrier according to the present invention.

FIG. 11 is a side sectional view showing one embodiment of the IC socket according to the present invention.

FIG. 12 is a plan view of a housing of the IC socket shown in FIG. 11.

FIG. 13 is a side sectional view of the IC socket shown in FIG. 11 while the IC socket receives the IC carrier and a lid is closed.

FIG. 14 is an enlarged side sectional view of a region A of FIG. 13.

FIG. 15 is a front sectional view of the double-sided electrode type BGA IC device.

FIG. 16 is a sectional end view, similar to FIG. 7, of the fourth embodiment of the IC carrier according to the present invention.

FIG. 17 is a sectional end view, similar to FIG. 7, of the fifth embodiment of the IC carrier according to the present invention.

EXPLANATION OF REFERENCE NUMERALS

10 IC device
14 bump electrode
18 upper electrode
24 IC carrier
26 IC socket
30 protrusion
32 peripheral portion
36 frame
38 device reception space
40 cover portion
42 resilient arm
43 positioning hole
54 guide reception space
56 through-hole
58 claw of resilient arm
64 device guide
72 housing
74 lid
92 device presser
98 carrier reception space
100 carrier guide
102 positioning pin
110 terminal

BEST MODE FOR CARRYING OUT THE INVENTION

Embodiments of the present invention will now be described in detail below with reference to the drawings.

FIG. 1 is an overall perspective view showing the first embodiment of an IC carrier according to the present invention and an IC socket to which the IC carrier is installed. A double-sided electrode type BGA IC device 10 is installed to an IC socket 26 along with an IC carrier 24 while the IC device 10 is held on the IC carrier 24.

FIG. 2(A) is a plan view (top view) of an IC device which can be mounted on the first embodiment of the IC carrier according to the present invention, and FIG. 2(B) is a front view thereof, and FIG. 2(C) is a bottom view thereof.

Referring to FIG. 2(A), the IC device 10 is the double-sided electrode type BGA and is very thin. The package 13 has the maximum thickness portion, whose thickness t is 0.63 mm, and the minimum thickness portion, whose thickness is 0.28 mm. The package 13 is square in outline and has a size of 12 mm times 12 mm. Such a compact and very thin IC device 10 is convenient to be handled while being held on the IC carrier.

This handling feature can prevent breakage and deflection of the IC device 10. Referring to FIGS. 2(A) and 2(B) together, the IC device 10 has the top surface which is provided with, near its center, a rectangular protrusion 30 which projects slightly higher than a peripheral portion 32. The surface of the protrusion 30 is flat. The peripheral portion 32 surrounds the protrusion and is lower than the protrusion by one step. The peripheral portion 32 is provided with upper electrodes 18 each of which has a flat surface. Although the upper electrodes 18 in FIG. 2(B) look like they project from the surface of the package 13, the surface of the upper electrodes 18 are actually almost in plane with the surface of the package 13.

On the other hand, explaining the structure on the bottom side of the IC device 10 with reference to FIGS. 2(B) and 2(C) together, the package 13 has a bottom surface 34 which is provided with a plurality of bump electrodes 14 arranged in a grid pattern. It is noted that, regarding the IC device 10, a surface which is provided with the bump electrodes 14 is referred to as the bottom surface 34 which corresponds to the first surface in the present invention, and a surface opposite the bottom surface 34 is referred to as the top surface which corresponds to the second surface of the present invention.

FIG. 3 is a bottom view of the first embodiment of the IC carrier according to the present invention, and FIG. 4 is a perspective view of the IC carrier as viewed from the bottom side with a part of the frame cut out. Referring to FIG. 3, the IC carrier 24 has a substantially square frame 36 which has an outline size of 25 mm times 25 mm. The frame 36 forms a device reception space 38 for receiving the IC device 10 shown in FIG. 2. The frame 36 is provided integrally with a cover portion 40 and four resilient arms 42, and the frame 36 is further provided with three positioning holes 43 which pass through the frame 36 in a direction of the thickness of the frame 36. The resilient arm 42 has an L-shape and has a first part 44 (a longer part) which extends parallel to the lateral face of the IC device held on the IC carrier. The first part 44 has a root 45 which is connected integrally with the frame 36. The second part 46 (a shorter part) is connected to the tip end of the first part 44 and is bent at right angle to the first part 44. The resilient arm 42 is surrounded by a vacant space 52 except at the root 45. Then, a guide reception space 54, which is comparatively wide, is formed at an inner side of the first part 44.

The frame 36 has, near its center, the cover portion 40 which has a bottom surface 48 (a region indicated by cross hatching in FIG. 3) which is set back from the bottom surface 50 of the frame 36 by one step toward the top surface (see FIG. 4). The bottom surface 48 of the cover portion 40 is to face the top surface of the IC device. When the IC device is held on the IC carrier 24, the cover portion 40 becomes in contact with the peripheral portion 32 of the IC device, so that the upper electrodes 18 (see FIG. 2) of the IC device is covered with the cover portion 40. Therefore, the cover portion 40 has an ability to protect the upper electrodes 18. The cover portion 40 is provided with, at its center, a square through-hole 56.

As shown in an enlarged view in FIG. 4, the second part 46 of the resilient arm 42 has a tip end which is provided with a claw 58. The arm 42 has an end face 60 which is set back from the claw 58 by one step. The claw 58 is to engage with the lateral edge (a corner between the lateral face and the bottom surface) of the IC device. The end face 60 is to push the lateral face of the IC device.

FIG. 5 is a perspective view of the second embodiment of the IC carrier according to the present invention as viewed from the bottom side. The second embodiment is different from the first embodiment in that the frame 36 is provided with a shallow counterbore 62 around the cover portion 40. A region which is set back by the counterbore 62 by one step is indicated by fine cross hatching. The counterbore 62 is substantially square in outline. The bottom surface of the second part 46 of the resilient arm 42 is slightly set back by the counterbore 62 from the bottom surface 50 of the frame 36 toward the top surface. Since there is the counterbore 62, the surface area of the bottom surface 50 is decreased and therefore the flatness of the bottom surface 50 is easily obtained.

FIG. 6 is a plan view (top view) of the IC carrier shown in FIG. 3. The frame 36 has, near its center, the cover portion 40 which has a top surface in plane with the top surface of the frame 36. The cover portion 40 is provided with the central through-hole 56 which is to allow the top surface of the IC device held on the IC carrier to be exposed.

FIG. 7 is a sectional end view taken along the line 7-7 in FIG. 6. The left half of FIG. 7 shows a sectional end face of the second part 46 of the resilient arm. The right half of FIG. 7 shows a sectional end face of the first part 44 of the resilient arm. It is noted that the sectional shape shown at the second part 46 of the resilient arm is that of the second embodiment shown in FIG. 5 (the counterbore 62 is formed). When the claw 58 of the resilient arm is deflected outward, the IC device 10 can be inserted into the device reception space 38 from the bottom side of the IC carrier 24. Thereafter, the claw 58 of the resilient arm returns, and the IC device 10 is held inside the IC carrier 24. The peripheral portion 32 of the top surface of the package of the IC device 10 is to face the bottom surface 48 of the cover portion 40. The IC device 10 is held between the bottom surface 48 of the cover portion 40 and the claw 58 of the resilient arm. Between the first part 44 of the resilient arm and the lateral face of the IC device 10 resides a guide reception space 54 into which a device guide 64 of the IC socket enters. An inner surface 106 of the device guide 64 is to locate the lateral face of the IC device 10, so that the IC device 10 is directly located with respect to the IC socket.

FIG. 8 is a bottom view of the IC carrier 24 shown in FIG. 3 while the resilient arms 42 are in the open states. The resilient arm 42 can be rotated (can be elastically deformed), with the use of the dedicated tool, counterclockwise in FIG. 8 as denoted by an arrow 66 with the root 45 of the first part 44 as an axis of rotation. Under such a condition, the IC device can be inserted inside the frame 36.

FIG. 9 is a bottom view of the IC carrier 24 shown in FIG. 3 while the IC carrier 24 holds the IC device 10. When the resilient arm 42 is released from the dedicated tool after the IC device 10 was held inside the frame 36, the resilient arm 42 returns to the original state under the own resilient restoration force. As a result, the four lateral edges of the IC device 10 are held by the claws 58 of the four resilient arms 42. Referring to an enlarged view in FIG. 3, when the resilient arm 42 is in the steady state (the state under no force), the end face 60 (see also FIG. 4) of the second part 46 of the resilient arm is positioned at a very small distance d1 inside the line 70 connecting lateral walls 68 (see also FIG. 4) which surround the bottom surface 48 of the cover portion 40. This feature is common to all the four resilient arms. Therefore, the IC device 10 shown in FIG. 9 is to be pushed toward the inside by the four resilient arms 42 respectively, so that the IC device 10 comes to rest on a position at which the resilient restoration forces of the four resilient arms 42 keep balance therebetween.

FIG. 10 is a bottom view of the third embodiment of the IC carrier according to the present invention. This embodiment is different from the first embodiment in the positions of the end faces 60 of the four resilient arms. The first resilient arm 42a and the second resilient arm 42b each has the end face 60a whose steady position is, as shown in an enlarged view, at almost the same position as the line 70a connecting lateral walls 68a which surround the bottom surface 48 of the cover portion 40. On the other hand, the third resilient arm 42c and the fourth resilient arm 42d each has the end face 60d whose steady position is at a distance d2 inside the line 70d connecting lateral walls 68d which surround the bottom surface 48 of the cover portion 40. The distance d2 is greater than the distance d1 shown in FIG. 3. As a result, two lateral faces of the IC device held by the four resilient arms 42 are pushed toward the inside by the resilient arms 42c and 42d, and the other two lateral faces come to be in contact with the lateral walls 68a and 68b, so that the IC device comes to rest on such a state. Accordingly, in the third embodiment, the upper side lateral wall 68a and the right side lateral wall 68b in FIG. 10 become the reference planes for locating the IC device with respect to the IC carrier 24.

FIG. 11 is a side sectional view showing one embodiment of the IC socket according to the present invention. The IC socket consists of a housing 72 and a lid 74. The lid 74 is rotatable with respect to the housing 72 and is resiliently biased counterclockwise in FIG. 11 by a helical torsion spring 76. The lid 74 has a tip end which is provided with a pivoted latch 78. The latch 78 is resiliently biased clockwise in FIG. 11 by a helical torsion spring 80. When the lid 74 is being rotated in the clockwise direction 75 to be closed, a claw 82 of the tip end of the latch 78 comes to be in contact with a slope 86 of the latch receiver 84 of the housing 72, and the latch 78 is rotated counterclockwise, and thereafter the latch 78 climbs over a protrusion 88 and returns to the original state under the resilient restoration force of the helical torsion spring 80, and finally the claw 82 engages with the latch receiver 84. As a result, the lid 74 remains in the closed state. When a knob 90, which is provided on the rear end of the latch 78, is moved counterclockwise against the helical torsion spring 80, the latch 78 comes out of the latch receiver 84 and therefore the lid 74 returns to the open state shown in FIG. 11 under the resilient restoration force of the helical torsion spring 76.

The lid 74 has an inner surface which is provided with, at its center, a device presser 92 which is biased in a direction denoted by an arrow 96 by a helical compression spring 94. The device presser 92 has an ability to push the top surface of the IC device 10 which is held on the IC carrier 24.

The housing 72 forms a carrier reception space 98. FIG. 12 is a plan view of the housing 72 of the IC socket. The IC carrier 24 which is received in the housing 72 is depicted with imaginary lines in FIG. 12. The lid 74 of the IC socket is depicted as in the upright posture and depicted with imaginary lines. It is noted that, in the sectional view of FIG. 11, a part of the housing 72 near the carrier reception space 98 shows a sectional end view taken along the line 11-11 in FIG. 12. Turning to FIG. 12, the housing 72 is provided with four carrier guides 100, four device guides 64 and three positioning pins 102, these parts being exposed to the carrier reception space 98. The carrier guide 100 is inclined as shown in FIG. 11 and guides the lateral face of the IC carrier 24 when the IC carrier 24 enters into the carrier reception space 98. Turning to FIG. 12 again, the three positioning pins 102 are to enter the three positioning holes 43 (see FIG. 6) of the IC carrier 24. The positioning pin 102 has a tip end which has a conical shape as shown in FIG. 1 so as to guide the positioning holes 43 of the IC carrier 24. A combination of the positioning pins 102 and the positioning holes 43 can locate the IC carrier 24 with respect to the IC socket 26. Referring to FIGS. 1 and 12, the device guide 64 can enter the guide reception space 54 of the IC carrier 24. The device guide 64 is provided with, at an upper and inner side, a slope 104 which guides the lateral face of the IC device 10 when the IC device 10 held on the IC carrier 24 enters the carrier reception space 98. Then, the inner surface 106 of the device guide 64 locates the lateral face of the IC device 10.

FIG. 13 is a side sectional view of the IC socket shown in FIG. 11 while the IC socket receives the IC carrier 24 and a lid 74 is closed. The bottom surface of the lid 74 is in contact with the top surface of the housing 72. The claw 82 of the latch 78 engages with the latch receiver 84. FIG. 14 is an enlarged side sectional view of a region A of FIG. 13. A lower plate 108 is fixed to the bottom side of the housing 72. Many terminals 110 (spring pins) are provided so as to penetrate the housing 72 and the lower plate 108. The top ends of the terminals 110 project into the device reception space of the housing 72. On the other hand, the top surface of the package of the IC device 10 is pressed downward by the device presser 92, so that the bump electrodes on the bottom surface of the package of the IC device 10 are pressed against the top ends of the terminals 110. The bottom ends of the terminals 110 are to be in contact with the electrodes of a tester, with which the IC device can be tested electrically.

FIG. 16 is a sectional end view, similar to FIG. 7, of the fourth embodiment of the IC carrier according to the present invention. This embodiment is different from the first embodiment in the structure of the cover portion. A cover portion 40a consists of a peripheral contact portion 112 and an end plate 114. The peripheral contact portion 112 is to be in contact with the peripheral portion 32 of the IC device 10. In comparison with this fourth embodiment, the cover portion 40 shown in FIG. 7 can be said to have a structure including only the peripheral contact portion. The end plate 114 of the cover portion 40a in FIG. 16 covers partially the protrusion 30 of the IC device 10. When the IC device 10 is held on the IC carrier 24a, the inner surface (the lower surface in FIG. 16) of the end plate 114 is apart from the protrusion 30 to form a gap therebetween. The end plate 114 is provided with, at its center, a though-hole 56a, which is smaller than the through-hole 56 of the cover portion 40 shown in FIG. 7. A device presser 92a of the IC device can pass through the through-hole 56a and is in contact directly with the protrusion 30 of the IC device 10. In response to the smaller through-hole 56a, also the outer diameter of the device presser 92a is smaller than that of the device presser 92 shown in FIG. 14.

FIG. 17 is a sectional end view, similar to FIG. 7, of the fifth embodiment of the IC carrier according to the present invention. This embodiment is different from the fourth embodiment shown in FIG. 16 in that the end plate of the cover plate is provided with no through-hole. A cover portion 40b consists of the peripheral contact portion 112 and an end plate 114b, the peripheral contact portion 112 being the same as that shown in FIG. 16. The end plate 114b is provided with no through-hole. The end plate 114b covers the whole protrusion 30 of the IC device 10. When the IC device 10 is held on the IC carrier 24b, the inner surface (the lower surface in FIG. 17) of the end plate 114b is apart from the protrusion 30 to form a gap therebetween. When installing the IC carrier 24b to the IC socket, the device presser 92b comes to be in contact with the end plate 114b of the cover portion 40b and therefore the IC device 10 is pressed against the terminals of the IC socket via the cover portion 40b.

The invention claimed is:

1. An IC carrier for holding a Ball Grid Array IC device including a package which has a first surface having a plurality of bump electrodes and a second surface opposite the first surface, the second surface having (a) a central protrusion, (b) a peripheral portion which surrounds the central protrusion and is lower in height than the central protrusion, and (c) a plurality of upper electrodes provided on the peripheral portion, wherein the IC carrier comprises:

a frame forming a device reception space for receiving the IC device;

a cover portion adapted to cover the upper electrodes of the IC device such that the cover portion is in contact with the peripheral portion of the IC device held on the IC carrier and is not in contact with the central protrusion of the IC device held on the IC carrier; and a holding device provided in the frame, the holding device being arranged to hold the IC device in the IC carrier while the cover portion covers the upper electrodes under a condition in which the bump electrodes of the IC device are exposed.

2. The IC carrier according to claim 1, wherein:

the IC device is rectangular; and the frame includes a plurality of positioning holes.

3. The IC carrier according to claim 1, wherein the cover portion has a through-hole through which at least a part of the central protrusion of the IC device held on the IC carrier is exposed.

4. The IC carrier according to claim 3, wherein:

the holding device includes resilient arms each of which has a tip end provided with a claw which engages with a lateral edge of the IC device; and the resilient arms are formed to be integrated with the frame.

5. The IC carrier according to claim 2, wherein:

the holding device includes four L-shape resilient arms each of which has a tip end provided with a claw, the claws of the resilient arms engaging with four lateral edges of the IC device respectively;

each resilient arm has a first part extending substantially parallel to a lateral face of the IC device held on the IC carrier and a second part connected to the first part and bent with respect to the first part, the second part having the tip end provided with the claw; and a guide reception space is formed between the first part and the lateral face of the IC device, the guide reception space being adapted to receive a device guide which guides the lateral face of the IC device.

6. An IC socket for receiving the IC carrier of claim 5 while the IC carrier is holding the IC device, wherein the IC socket comprises:

a housing forming a carrier reception space which receives the IC carrier;

a plurality of positioning pins provided on the housing, the positioning pins being adapted to be inserted into the positioning holes of the IC carrier to locate the IC carrier with respect to the IC socket;

a device guide provided in the housing, the device guide being adapted to be inserted into the guide reception space of the IC carrier to guide the lateral face of the IC device so that the IC device is located with respect to the IC socket;

a plurality of terminals fixed to the housing, the terminals being arranged to electrically contact the bump electrodes of the IC device; and a device presser capable of one of (i) entering into a through-hole which is formed in the cover portion of the IC carrier to press the IC device toward the terminals, and (ii) contacting the cover portion of the IC carrier to press the cover portion toward the terminals.

7. A method for testing an IC device comprising:
holding the IC device on an IC carrier; and
testing the IC device while it is held on the IC carrier;
wherein the IC device is a Ball Grid Array IC device including a package which has a first surface having a plurality of bump electrodes and a second surface opposite the first surface, the second surface having (a) a central protrusion, (b) a peripheral portion which surrounds the central protrusion and is lower in height than the central protrusion, and (c) a plurality of upper electrodes provided on the peripheral portion; and
wherein the IC carrier is an IC carrier for holding said Ball Grid Array IC device, the IC carrier comprising:
a frame forming a device reception space for receiving the IC device;
a cover portion adapted to cover the upper electrodes of the IC device such that the cover portion is in contact with the peripheral portion of the IC device held on the IC carrier and is not in contact with the central protrusion of the IC device held on the IC carrier; and
a holding device provided in the frame, the holding device being arranged to hold the IC device in the IC carrier while the cover portion covers the upper electrodes under a condition in which the bump electrodes of the IC device are exposed.

8. The IC carrier according to claim 2, wherein the cover portion has a through-hole through which at least a part of the central protrusion of the IC device held on the IC carrier is exposed.

9. The IC carrier according to claim 8, wherein:
the holding device includes resilient arms each of which has a tip end provided with a claw which engages with a lateral edge of the IC device; and
the resilient arms are formed to be integrated with the frame.

10. The IC carrier according to claim 1, wherein:
the holding device includes resilient arms each of which has a tip end provided with a claw which engages with a lateral edge of the IC device; and
the resilient arms are formed to be integrated with the frame.

11. The IC carrier according to claim 2, wherein:
the holding device includes resilient arms each of which has a tip end provided with a claw which engages with a lateral edge of the IC device; and
the resilient arms are formed to be integrated with the frame.

12. The method for testing an IC device according to claim 7, wherein:
the IC device is rectangular; and
the frame includes a plurality of positioning holes.

13. The method for testing an IC device according to claim 7, wherein the cover portion has a through-hole through which at least a part of the central protrusion of the IC device held on the IC carrier is exposed.

14. The method for testing an IC device according to claim 13, wherein:
the holding device includes resilient arms each of which has a tip end provided with a claw which engages with a lateral edge of the IC device; and
the resilient arms are formed to be integrated with the frame.

15. The method for testing an IC device according to claim 12, wherein:
the holding device includes four L-shape resilient arms each of which has a tip end provided with a claw, the claws of the resilient arms engaging with four lateral edges of the IC device respectively;
each resilient arm has a first part extending substantially parallel to a lateral face of the IC device held on the IC carrier and a second part connected to the first part and bent with respect to the first part, the second part having the tip end provided with the claw; and
a guide reception space is formed between the first part and the lateral face of the IC device, the guide reception space being adapted to receive a device guide which guides the lateral face of the IC device.

16. The method for testing an IC device according to claim 12, wherein the cover portion has a through-hole through which at least a part of the central protrusion of the IC device held on the IC carrier is exposed.

17. The method for testing an IC device according to claim 16, wherein:
the holding device includes resilient arms each of which has a tip end provided with a claw which engages with a lateral edge of the IC device; and
the resilient arms are formed to be integrated with the frame.

18. The method for testing an IC device according to claim 7, wherein:
the holding device includes resilient arms each of which has a tip end provided with a claw which engages with a lateral edge of the IC device; and
the resilient arms are formed to be integrated with the frame.

19. An IC carrier for holding a Ball Grid Array IC device including a package which has a first surface having a plurality of bump electrodes and a second surface opposite the first surface, the second surface having (a) a central protrusion, (b) a peripheral portion which surrounds the central protrusion and is lower in height than the central protrusion, and (c) a plurality of upper electrodes provided on the peripheral portion, wherein the IC carrier comprises:
a frame forming a device reception space for receiving the IC device;
a cover portion adapted to cover the upper electrodes of the IC device such that the cover portion is in contact with the peripheral portion of the IC device held on the IC carrier; and
a holding device provided in the frame, the holding device being arranged to hold the IC device in the IC carrier while the cover portion covers the upper electrodes,
wherein:
the IC device is rectangular,
the frame includes a plurality of positioning holes,
the IC carrier is arranged to hold the IC device under a condition in which the bump electrodes of the IC device are exposed,
the holding device includes four L-shape resilient arms each of which has a tip end provided with a claw, the claws of the resilient arms engaging with four lateral edges of the IC device respectively,
each resilient arm has a first part extending substantially parallel to a lateral face of the IC device held on the IC carrier and a second part connected to the first part and bent with respect to the first part, the second part having the tip end provided with the claw, and
a guide reception space is formed between the first part and the lateral face of the IC device, the guide reception space being adapted to receive a device guide which guides the lateral face of the IC device.

20. An IC socket for receiving the IC carrier of claim 19 while the IC carrier is holding the IC device, wherein the IC socket comprises:
   a housing forming a carrier reception space which receives the IC carrier;
   a plurality of positioning pins provided on the housing, the positioning pins being adapted to be inserted into the positioning holes of the IC carrier to locate the IC carrier with respect to the IC socket;
   a device guide provided in the housing, the device guide being adapted to be inserted into the guide reception space of the IC carrier to guide the lateral face of the IC device so that the IC device is located with respect to the IC socket;
   a plurality of terminals fixed to the housing, the terminals being arranged to electrically contact the bump electrodes of the IC device; and
   a device presser capable of one of (i) entering into a through-hole which is formed in the cover portion of the IC carrier to press the IC device toward the terminals, and (ii) contacting the cover portion of the IC carrier to press the cover portion toward the terminals.

* * * * *

UNITED STATES PATENT AND TRADEMARK OFFICE
CERTIFICATE OF CORRECTION

| | | |
|---|---|---|
| PATENT NO. | : 7,884,630 B2 | Page 1 of 1 |
| APPLICATION NO. | : 11/886139 | |
| DATED | : February 8, 2011 | |
| INVENTOR(S) | : Eichi Osato et al. | |

It is certified that error appears in the above-identified patent and that said Letters Patent is hereby corrected as shown below:

On the Title Page, Item (54) and in Column 1, Line 1 (Title):
        delete "CARRIE" and insert --CARRIER--

Signed and Sealed this
Sixteenth Day of October, 2012

David J. Kappos
*Director of the United States Patent and Trademark Office*